(12) United States Patent
Kamikubo (10) Patent No.: US 8,301,291 B2
(45) Date of Patent: Oct. 30, 2012

(54) CHARGED PARTICLE BEAM WRITING APPARATUS, WRITE DATA CREATION METHOD AND CHARGED PARTICLE BEAM WRITING METHOD

(75) Inventor: Takashi Kamikubo, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/108,299

(22) Filed: May 16, 2011

(65) Prior Publication Data

US 2011/0286319 A1 Nov. 24, 2011

(30) Foreign Application Priority Data

May 19, 2010 (JP) .................. 2010-115586

(51) Int. Cl.
*G06F 19/00* (2006.01)
(52) U.S. Cl. ........................... 700/121; 430/4
(58) Field of Classification Search .................. None
See application file for complete search history.

(56) References Cited

U.S. PATENT DOCUMENTS 6,313,476 B1 11/2001 Shimizu et al.
7,740,991 B2 6/2010 Emi et al.

FOREIGN PATENT DOCUMENTS

JP 2007-150243 6/2007

*Primary Examiner* — Paul Huber (74) *Attorney, Agent, or Firm* — Oblon, Spivak, McClelland, Maier & Neustadt, L.L.P.

(57) ABSTRACT

A charged particle beam writing apparatus according to an embodiment, includes a storage device configured to store write data which is to be written by using a charged particle beam and in which a plurality of patterns with different writing precision is defined; a cutout unit configured to read data of each pattern from the storage device and to cut out a partial pattern, among a pattern, in the plurality of patterns, whose writing precision is on a low-precision side, positioned within a range of influence of a proximity effect from a region edge of a pattern, in the plurality of patterns, whose writing precision is on a high-precision side; a merge processing unit configured to perform merge processing of a cut-out partial pattern on the low-precision side and the pattern on the high-precision side; and a pattern writing unit configured to write a pattern obtained by the merge processing and a remaining partial pattern on the low-precision side remaining without being merged with the pattern on the high-precision side to a target object by using the charged particle beam under different writing conditions based on data of the pattern obtained by the merge processing and data of the remaining partial pattern.

10 Claims, 5 Drawing Sheets

CHARGED PARTICLE BEAM WRITING APPARATUS, WRITE DATA CREATION METHOD AND CHARGED PARTICLE BEAM WRITING METHOD

CROSS-REFERENCE TO RELATED APPLICATION

This application is based upon and claims the benefit of priority from prior Japanese Patent Application No. 2010-115586 filed on May 19, 2010 in Japan, the entire contents of which are incorporated herein by reference.

BACKGROUND OF THE INVENTION

1. Field of the Invention

The present invention relates to a charged particle beam writing apparatus, a write data creation method, and a charged particle beam writing method and, for example, relates to a method of creating new write data by reconfiguring write data used for electron beam writing.

2. Related Art

A lithography technique which leads development of micropatterning of a semiconductor device is a very important process for exclusively generating a pattern in semiconductor manufacturing processes. In recent years, with an increase in integration density of an LSI, a circuit line width required for semiconductor devices is getting smaller year by year. In order to form a desired circuit pattern on such a semiconductor device, a high-precision original pattern (also called a reticle or a mask) is necessary. In this case, an electron beam writing technique has an essentially excellent resolution, and is used in production of high-precision original patterns.

Figure 7:
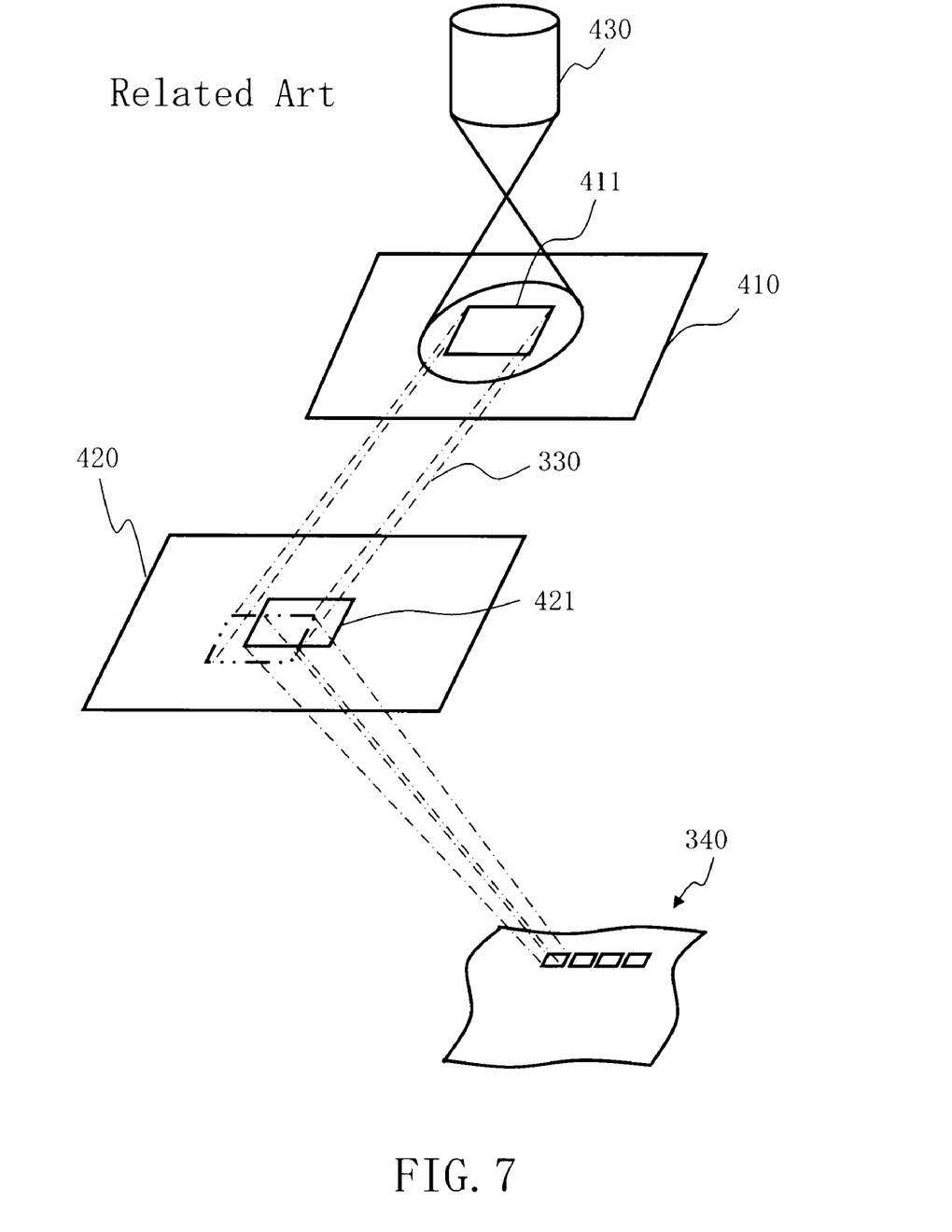
FIG. 7 is a conceptual diagram for explaining an operation of a variable-shaped electron beam writing apparatus.

FIG. 7 is a conceptual diagram for explaining an operation of a variable-shaped electron beam writing apparatus. The variable-shaped electron beam (EB: Electron beam) writing apparatus operates as follows. An oblong, for example, rectangular opening 411 to shape an electron beam 330 is formed in a first aperture plate 410. A variable-shaped opening 421 to shape the electron beam 330 having passed through the opening 411 of the first aperture plate 410 into a desired oblong shape is formed in a second aperture plate 420. The electron beam 330 irradiated from a charged particle source 430 and having passed through the opening 411 of the first aperture plate 410 is deflected by a deflector, passes through a part of a variable-shaped opening 421 of the second aperture plate 420, and is shone on a target object 340 placed on a stage continuously moving in one predetermined direction (for example, an X direction). That is, an oblong shape which can pass through both the opening 411 of the first aperture plate 410 and the variable-shaped opening 421 of the second aperture plate 420 is written in a write region of the target object 340 placed on the stage continuously moving in the X direction. A scheme which causes an electron beam to pass through both the opening 411 of the first aperture plate 410 and the variable-shaped opening 421 of the second aperture plate 420 to form an arbitrary shape is called a variable-shaping scheme (VSB scheme).

With patterns increasingly finer in recent years, more precise and faster writing is demanded for electron beam writing. To deal with such circumstances, a method of ranking write patterns in the mask based on writing precision is proposed. According to such a method, main patterns requiring high precision and peripheral patterns for which low precision is enough are separated. Operation processing of write data is performed separately. Then, each pattern is written using write parameters in accordance with respective precision.

In such electron beam writing, on the other hand, if a mask coated with a resist is irradiated with an electron beam to write a pattern, a phenomenon called a proximity effect caused by back scattering by the electron beam that passes through the resist layer to reach a layer below the resist layer and then reenters the resist layer occurs. Dimensional fluctuations in which lines are written in dimensions deviating from desired dimensions when lines are written are thereby caused. Thus, various methods of correcting the proximity effect have conventionally been proposed. To correct the proximity effect of the applicable pattern, it is also necessary to consider patterns around the position thereof within the range of influence of the proximity effect.

If, as described above, an attempt is made to separate main patterns requiring high precision from peripheral patterns for which low precision is enough, when viewed from one pattern, a part of the other pattern may be contained within the range of influence of the proximity effect. In such a case, there is a problem that the proximity effect of main patterns cannot be corrected if main patterns and peripheral patterns are separated. As a result, dimensional precision of main patterns deteriorates.

Regarding the proximity effect correction, there is a method of operating the dose by changing values such as a base dose of the beam $D_{base}$ used for operating the dose and a proximity effect correction coefficient η to correct the proximity effect depending on the position (see, for example, Japanese Patent Application Laid-Open No. 2007-150243). However, if main patterns and peripheral patterns are separated, even according to such a method, it is difficult to solve the problem of becoming unable to correct the proximity effect of the main patterns.

As described above, even if main patterns requiring high precision and peripheral patterns for which low precision is enough should be separated, when viewed from one pattern, a part of the other pattern may be contained within the range of influence of the proximity effect. In such a case, there is a problem that the proximity effect of main patterns cannot be corrected if main patterns and peripheral patterns are separated. As a result, dimensional precision of main patterns deteriorates. However, conventionally, a method of solving the problem has not been established yet.

BRIEF SUMMARY OF THE INVENTION

A charged particle beam writing apparatus according to an embodiment, includes a storage device configured to store write data which is to be written by using a charged particle beam and in which a plurality of patterns with different writing precision is defined; a cutout unit configured to read data of each pattern from the storage device and to cut out a partial pattern, among a pattern, in the plurality of patterns, whose writing precision is on a low-precision side, positioned within a range of influence of a proximity effect from a region edge of a pattern, in the plurality of patterns, whose writing precision is on a high-precision side; a merge processing unit configured to perform merge processing of a cut-out partial pattern on the low-precision side and the pattern on the high-precision side; and a pattern writing unit configured to write a pattern obtained by the merge processing and a remaining partial pattern on the low-precision side remaining without being merged with the pattern on the high-precision side to a target object by using the charged particle beam under different writing conditions based on data of the pattern obtained by the merge processing and data of the remaining partial pattern.

A write data creation method according to an embodiment, includes reading data of each pattern from a storage device storing write data which is to be written by using a charged particle beam and in which a plurality of patterns with different writing precision is defined, and cutting out a partial pattern, among a pattern, in the plurality of patterns, whose writing precision is on a low-precision side, positioned within a range of influence of a proximity effect from a region edge of a pattern, in the plurality of patterns, whose writing precision is on a high-precision side; performing merge processing of a cut-out partial pattern on the low-precision side and the pattern on the high-precision side; and outputting data of a pattern obtained by performing the merge processing and data of a remaining partial pattern on the low-precision side remaining without being cut out.

A charged particle beam writing method according to an embodiment, includes reading data of each pattern from a storage device storing write data which is to be written by using a charged particle beam and in which a plurality of patterns with different writing precision is defined, and cutting out a partial pattern, among a pattern, in the plurality of patterns, whose writing precision is on a low-precision side, positioned within a range of influence of a proximity effect from a region edge of a pattern, in the plurality of patterns, whose writing precision is on a high-precision side; performing merge processing of a cut-out partial pattern on the low-precision side and the pattern on the high-precision side; and writing a pattern obtained by the merge processing and a remaining partial pattern on the low-precision side remaining without being merged with the pattern on the high-precision side to a target object by using the charged particle beam under different writing conditions based on data of the pattern obtained by the merge processing and data of the remaining partial pattern.

DETAILED DESCRIPTION OF THE INVENTION

First Embodiment

In the following embodiment, a configuration which uses an electron beam as an example of a charged particle beam will be described. The charged particle beam is not limited to an electron beam, and a beam such as an ion beam using charged particles may be used. A variable-shaped writing apparatus as an example of a charged particle beam apparatus will be described.

Also, in the embodiment, a method and an apparatus enabling fast writing while improving dimensional precision of a high-precision pattern will be described.

Figure 1:
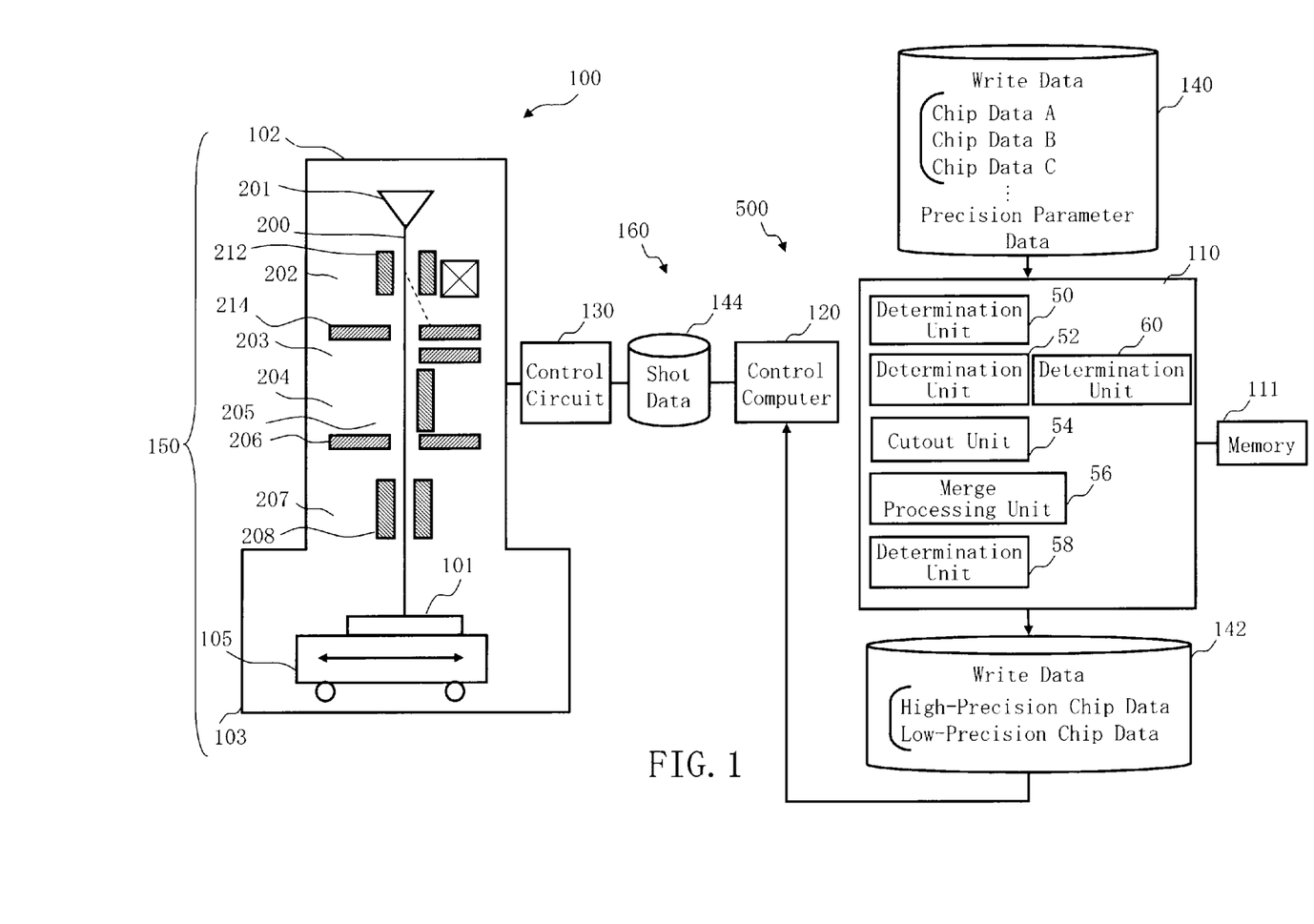
FIG. 1 is a conceptual diagram showing a configuration of a writing apparatus according to a first embodiment.

FIG. 1 is a conceptual diagram showing a configuration of a writing apparatus according to a first embodiment. In FIG. 1, a writing apparatus 100 includes a pattern writing unit 150 and a control unit 160. The writing apparatus 100 is an example of the charged particle beam writing apparatus. Particularly, the writing apparatus 100 is an example of the variable-shaped (VSB type) writing apparatus. The pattern writing unit 150 has an electron lens barrel 102 and a pattern writing chamber 103. In the electron lens barrel 102, an electron gun assembly 201, an illumination lens 202, a blanking deflector (blanker) 212, a blanking aperture plate 214, a first shaping aperture plate 203, a projection lens 204, a deflector 205, a second shaping aperture plate 206, an objective lens 207, and a deflector 208 are arranged. In the pattern writing chamber 103, an X-Y stage 105 capable of moving at least in the XY directions is arranged. On the X-Y stage 105, a target object 101 coated with a resist and to be written to is placed. The target object 101 includes, for example, a mask for exposure and a silicon wafer to produce a semiconductor device. The mask includes mask blanks.

The control unit 160 includes a control computer 120, a storage device 144 such as a magnetic disk drive, and a control circuit 130. The control computer 120, the storage device 144, and the control circuit 130 are mutually connected via a bus (not shown). The control circuit 130 is connected to the pattern writing unit 150 to drive and control each mechanism in the pattern writing unit 150.

A write data creation apparatus 500 includes a control computer 110, a memory 111, and storage devices 140, 142 such as magnetic disk drives. The control computer 110, the memory 111, and the storage devices 140, 142 are mutually connected via a bus (not shown). In the control computer 110, determination units 50, 52, 58, 60, a cutout unit 54, and a merge processing unit 56 are arranged. Each function of the determination units 50, 52, 58, 60, the cutout unit 54, and the merge processing unit 56 may be configured by software such as a program. Alternatively, such functions may be configured by hardware such as an electronic circuit. In addition to the above alternatives, these alternatives may be combined. Input data necessary for the control computer 110 or an operation result is stored each time in the memory 111.

The write data creation apparatus 500 creates new write data by reconfiguring write data input from outside and stored in the storage device 140. More specifically, write data includes a plurality of pieces of chip data (pattern data) with different writing precision. The write data creation apparatus 500 performs merge processing of the plurality of pieces of chip data separately based on writing precision. At this time, as described later, merge processing is performed in such a way that the proximity effect of a high-precision pattern can be corrected. Then, the reconfigured write data is output and stored in the storage device 142.

Then, on the writing apparatus 100 side, a plurality of stages of data conversion processing and a proximity effect correction operation are performed by the control computer 120 by using reconfigured write data stored in the storage device 142 to generate shot data specific to the writing apparatus 100 and to store the shot data in the storage device 144. The control circuit 130 writes a pattern to the target object 101 by controlling the pattern writing unit 150 according to the generated shot data. Here, only components needed to explain the first embodiment are shown in FIG. 1. The write data creation apparatus 500 and the writing apparatus 100 may include other components usually needed for the write data creation apparatus 500 and the writing apparatus 100, respectively. For example, each DAC amplification unit for the deflector 205 or the deflector 208 may be included. Also, for example, an interface circuit with an external device, printer, monitor, or keyboard may be included.

In FIG. 1, the write data creation apparatus 500 and the writing apparatus 100 are separate apparatuses, but the present embodiment is not limited to this. The write data creation apparatus 500 may constitute a portion of the writing apparatus 100. Also in such a case, the control computer 110 and the control computer 120 may be configured as one control computer without distinguishing the control computer.

Figure 2:
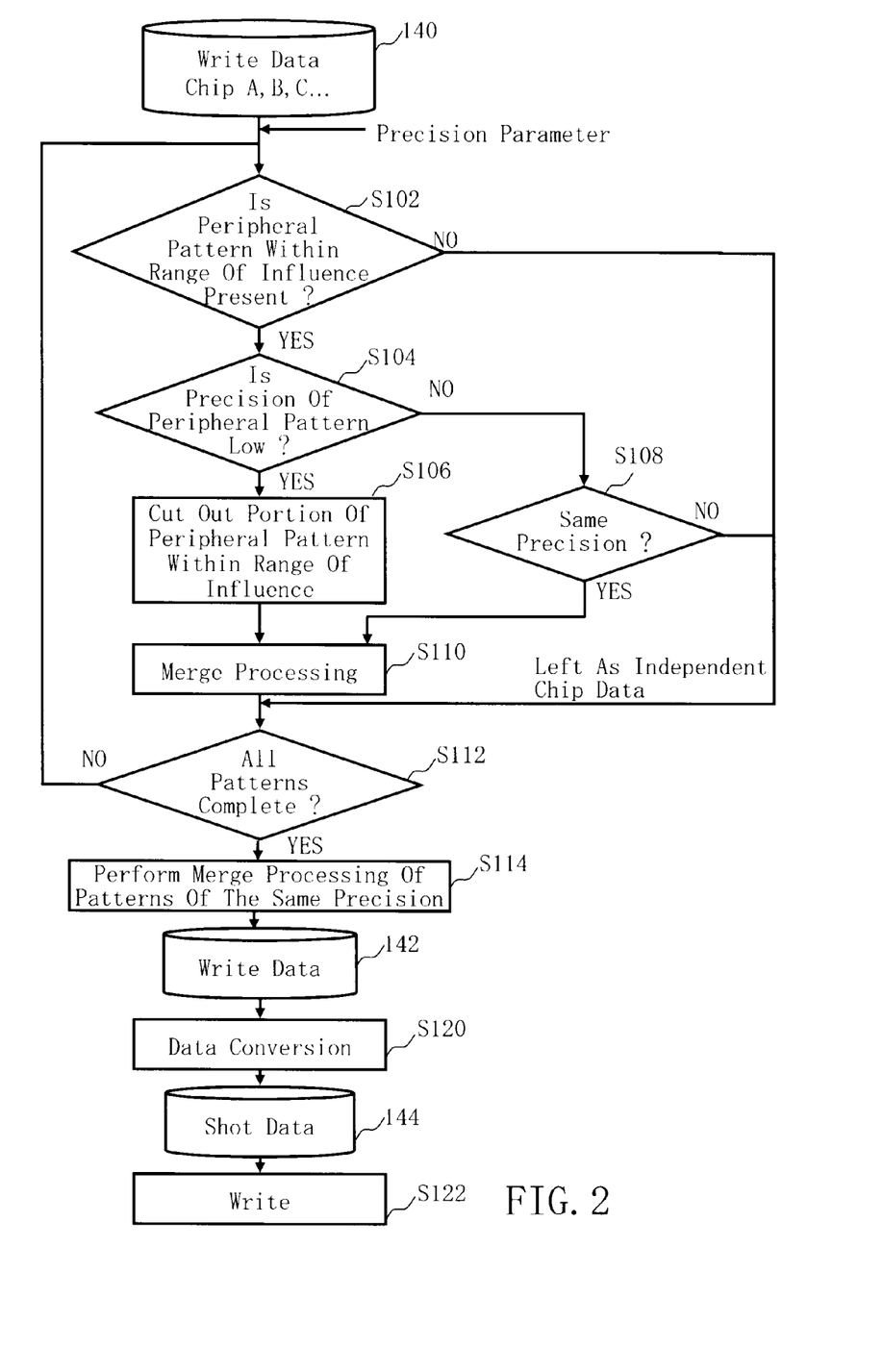
FIG. 2 is a flowchart showing principal portion processes of a writing method according to the first embodiment.

FIG. 2 is a flowchart showing principal portion processes of a writing method according to the first embodiment. In FIG. 2, the writing method in the first embodiment executes a series of processes including a determination process (S102), a determination process (S104), a cutout process (S106), a determination process (S108), a merge processing process (S110), a determination process (S112), a merge processing process (S114), a data conversion process (S120), and a writing process (S122). The determination process (S102), the determination process (S104), the cutout process (S106), the determination process (S108), the merge processing process (S110), and the determination process (S112) correspond to each process of the write data creation method in the first embodiment as internal processes of the writing method. In the first embodiment, the creation method of creating new write data by reconfiguring write data executed in the write data creation apparatus 500 will mainly be described.

In the storage device 140, write data in which a plurality of patterns with different writing precision is defined is stored. As an example of data of the plurality of patterns with different writing precision, a case where a plurality of pieces of chip data A, B, C, . . . is stored will be described. The storage device 140 has the writing precision necessary for a pattern defined by each piece of chip data stored as precision parameter data. Generally, a plurality of pieces of chip data is input into the writing apparatus 100 as one piece of chip data with merge processing performed thereon. Alternatively, merge processing on a plurality of pieces of chip data is performed in the writing apparatus 100 into one piece of chip data. If subsequent data processing and writing processing are performed by the writing apparatus 100 in such a state, a pattern will be written under the same writing conditions regardless of the writing precision. In such a case, the precision of a high-precision pattern cannot be lowered and thus, a low-precision pattern will be written under the same writing conditions as a high-precision pattern. As a result, the writing speed will be slower. Thus, high-precision patterns and low-precision patterns are separated and then, writing processing is performed as separate data. However, if high-precision patterns and low-precision patterns are simply separated, as described above, it becomes difficult to correct the proximity effect.

Figure 3:
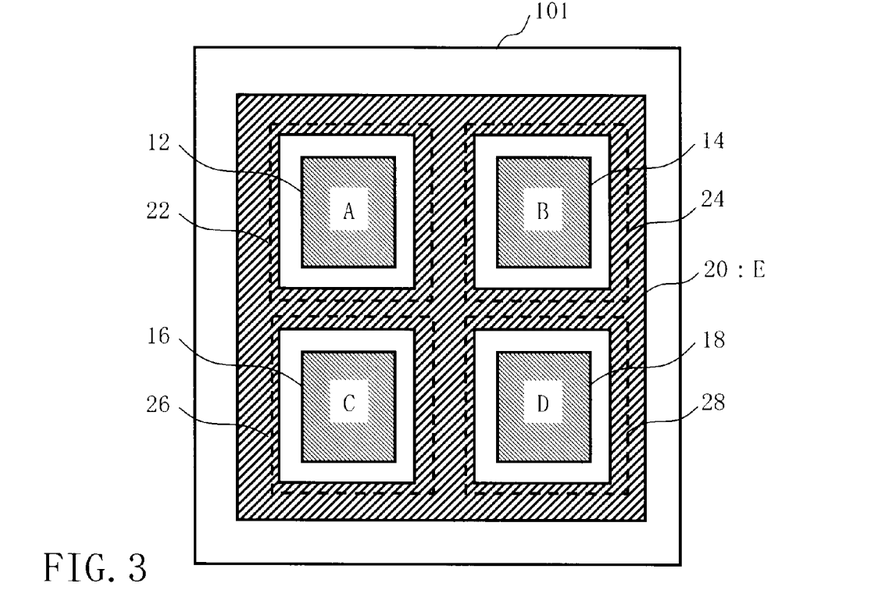
FIG. 3 is a diagram exemplifying a pattern layout in the first embodiment.

FIG. 3 is a diagram exemplifying a pattern layout in the first embodiment. FIG. 3 shows, as an example, a case where chips 12, 14, 16, 18 (chips A, B, C, D) requiring high writing precision (dimensional precision) and a peripheral pattern 20 (chip E) for which low writing precision is enough are written to the target object 101. The peripheral pattern 20 is arranged around the chip 12 to be a high-precision pattern. Similarly, the peripheral pattern 20 is arranged around the chip 13. The peripheral pattern 20 is arranged around the chip 16. The peripheral pattern 20 is arranged around the chip 18. In FIG. 3, a portion of the peripheral pattern 20 is positioned within a range of influence 22 of the proximity effect from a region edge of the pattern of the chip 12 on the high-precision side. Similarly, a portion of the peripheral pattern 20 is positioned in ranges of influence 24, 26, 28 of the proximity effect from region edges of patterns of the other chips 14, 16, 18, respectively. If the high-precision pattern side with the chips 12, 14, 16, 18 and the low-precision pattern side with the peripheral pattern 20 are simply separated in such a layout, it becomes difficult to perform operations to correct the proximity effect near the region edges of patterns particularly when patterns of the chips 12, 14, 16, 18 on the high-precision pattern side are written. Thus, in the first embodiment, write data is reconfigured by separating patterns as described below.

As the determination process (S102), the determination unit 50 (an example of a presence determination unit) inputs data of each pattern from the storage device 140 to determine whether any other pattern is present within the range of influence of the proximity effect from the region edge of the pattern (target pattern). In the example in FIG. 3, the determination unit 50 first inputs chip data A from the storage device 140 to determine whether any other pattern is present within the range of influence 22 of the proximity effect from the region edge of the chip 12 defined by the chip data A. If no other pattern is present, the processing proceeds to S112 with the independent chip data A. If another pattern is present, the processing proceeds to S104. For example, the radius of influence of the proximity effect of $3\sigma$ (sigma) can suitably be set as the range of influence 22 of the proximity effect. In the example in FIG. 3, the peripheral pattern 20 is present.

As the determination process (S104), the determination unit 52 (an example of a precision determination unit) determines whether the writing precision defined for the peripheral pattern (other pattern) present within the range of influence of the proximity effect from the region edge of the pattern (target pattern) is lower than the writing precision defined for the pattern by referring to precision parameter data stored in the storage device 140. In the example in FIG. 3, it is determined whether the writing precision defined for the peripheral pattern 20 present within the range of influence 22 of the proximity effect is lower than the writing precision defined for the chip 12 defined by the chip data A. If the writing precision defined for the peripheral pattern 20 present within the range of influence 22 of the proximity effect is lower, the processing proceeds to S106 and if the writing precision defined for the peripheral pattern 20 is not lower, the processing proceeds to S108.

As the cutout process (S106), the cutout unit 54 reads data of each pattern from the storage device 140 to cut out partial patterns, among patterns whose writing precision is on the low-precision side, positioned within the range of influence of the proximity effect from the region edge of patterns whose writing precision is on the high-precision side. In the example in FIG. 3, partial patterns of the peripheral pattern 20 on the low-precision side positioned within the range of influence 22 of the proximity effect from the region edge of the chip 12 on the high-precision side are cut out.

Figure 4:
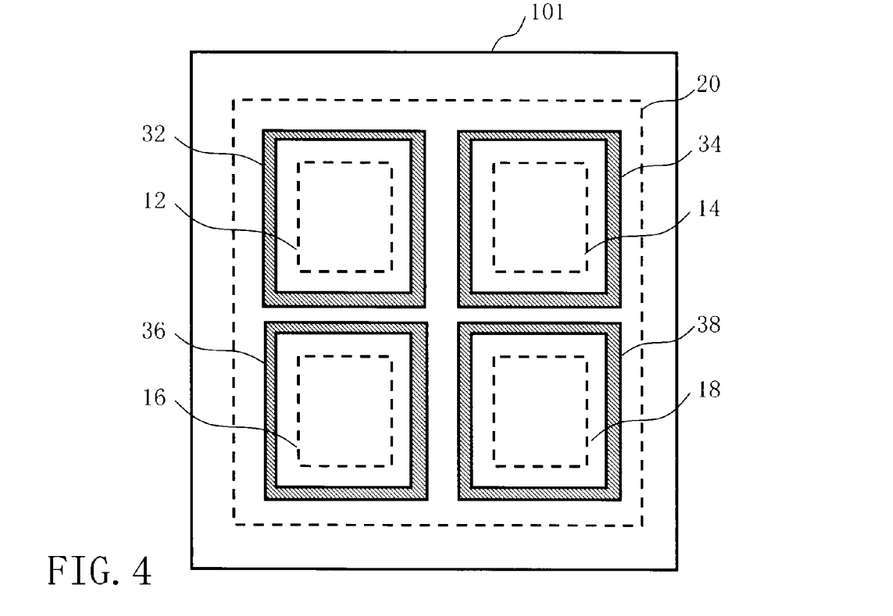
FIG. 4 is a diagram exemplifying a partial pattern in the first embodiment.

FIG. 4 is a diagram exemplifying a partial pattern in the first embodiment. In FIG. 4, patterns other than partial patterns are indicated by a dotted line. A partial pattern 32 of the peripheral pattern 20 on the low-precision side is positioned within the range of influence 22 of the proximity effect from the region edge of the chip 12 on the high-precision side. The cutout unit 54 cuts out the partial pattern 32 from the peripheral pattern 20.

As the determination process (S108), if the determination process (S104) determines that the writing precision defined for the peripheral pattern present within the range of influence of the proximity effect from the region edge of the pattern is not lower, the determination unit 58 determines whether the writing precision defined for the pattern and the writing precision defined for the peripheral pattern are the same precision. If the writing precision for both cases is the same precision, the processing proceeds to S110. If the writing precision for both cases is not the same precision, the processing proceeds to S112.

As the merge processing process (S110), the merge processing unit 56 performs merge processing of the cut-out partial pattern on the low-precision side and the pattern on the high-precision side. The merge processing unit 56 also performs merge processing of patterns determined to have the same precision.

Figure 5:
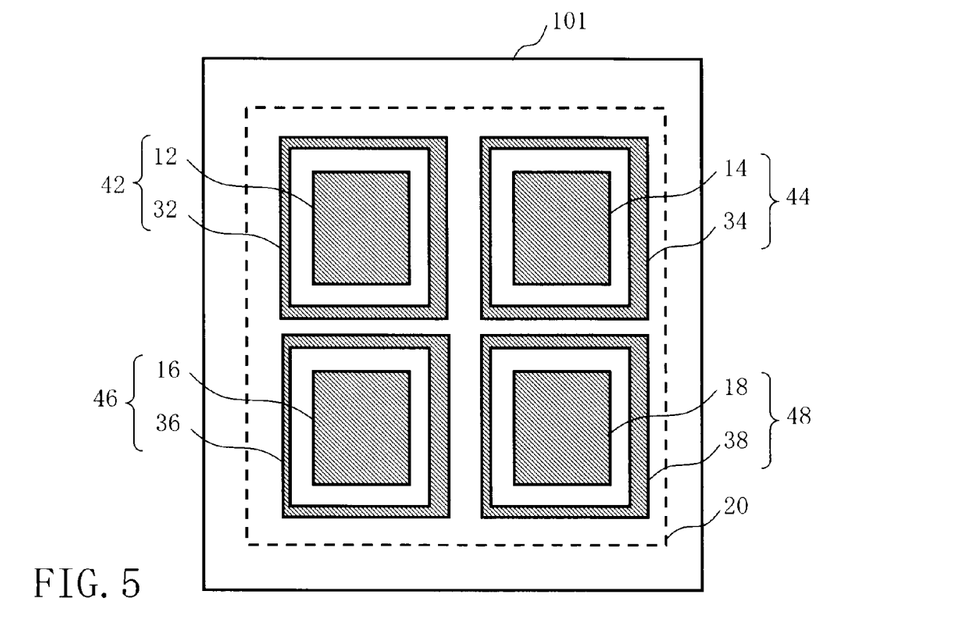
FIG. 5 is a diagram exemplifying a new pattern after merge processing of cut-out partial patterns in the first embodiment.

FIG. 5 is a diagram exemplifying a new pattern after merge processing of the cut-out partial pattern in the first embodiment. In FIG. 5, merge processing of the chip 12 to be a pattern on the high-precision side and the cut-out partial pattern 32 is performed to create a chip 42 of a new pattern. Accordingly, the partial pattern 32 can be included in operations when the proximity effect of the chip 12 is corrected. As a result, a pattern near the region edge of the chip 12 can also maintain high-precision dimensions. Though the partial pattern 32 is also included for operation of the proximity effect correction, low precision is originally enough for the partial pattern 32 and thus, if the proximity effect is similarly corrected, the influence therearound may not be taken into consideration.

As the determination process (S112), the determination unit 60 determines whether processing of all patterns is completed. If any pattern remains, the processing returns to S102 to repeat processes from the determination process (S102) to the determination process (S112) until processing of all patterns is completed. In the example in FIG. 3, in addition to the chip 12, the chips 14, 16, 18 and the peripheral pattern 20 are present and thus processes from the determination process (S102) to the determination process (S112) are sequentially executed for each chip.

As a result, the peripheral pattern 20 whose writing precision is lower than the writing precision of the chip 14 is present within the range of influence 24 of the proximity effect from the region edge of the chip 14 defined by the chip data B and thus, a partial pattern 34 shown in FIG. 4 is cut out. Then, as shown in FIG. 5, merge processing of the chip 14 and the partial pattern 34 is performed to create a chip 44 of a new pattern. Accordingly, the partial pattern 34 can be included in operations when the proximity effect of the chip 14 is corrected. As a result, a pattern near the region edge of the chip 14 can also maintain high-precision dimensions.

Similarly, the peripheral pattern 20 whose writing precision is lower than the writing precision of the chip 16 is present within the range of influence 26 of the proximity effect from the region edge of the chip 16 defined by the chip data C and thus, a partial pattern 36 shown in FIG. 4 is cut out. Then, as shown in FIG. 5, merge processing of the chip 16 and the partial pattern 36 is performed to create a chip 46 of a new pattern. Accordingly, the partial pattern 36 can be included in operations when the proximity effect of the chip 16 is corrected. As a result, a pattern near the region edge of the chip 16 can also maintain high-precision dimensions.

Similarly, the peripheral pattern 20 whose writing precision is lower than the writing precision of the chip 18 is present within the range of influence 28 of the proximity effect from the region edge of the chip 18 defined by the chip data D and thus, a partial pattern 38 shown in FIG. 4 is cut out. Then, as shown in FIG. 5, merge processing of the chip 18 and the partial pattern 38 is performed to create a chip 48 of a new pattern. Accordingly, the partial pattern 38 can be included in operations when the proximity effect of the chip 18 is corrected. As a result, a pattern near the region edge of the chip 18 can also maintain high-precision dimensions.

For the peripheral pattern 20 defined by the chip data E, on the other hand, the writing precision of the chips 12, 14, 16, 18 therearound is higher and thus, the processing proceeds, after the determination process (S104), to the determination process (S108) before proceeding to the determination process (S112) with data of the remaining partial pattern after the partial patterns 32, 34, 36, 38 being cut out. Then, after it is determined that processing of all patterns is completed in the determination process (S112), the processing proceeds to the merge processing process (S114).

As the merge processing process (S114), the merge processing unit 56 performs merge processing of patterns of the same precision in the pattern layout.

Figure 6:
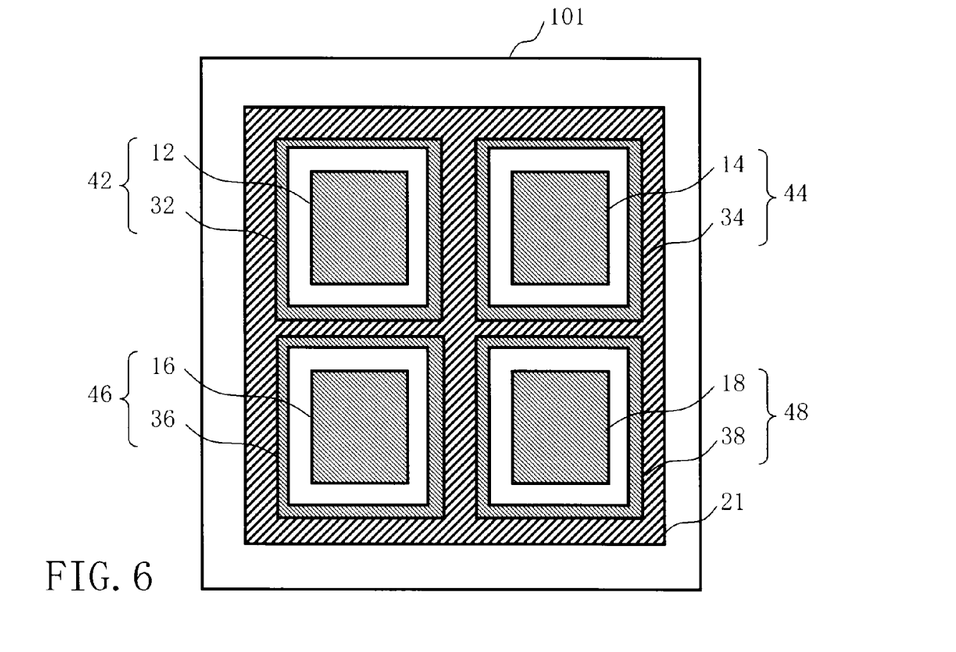
FIG. 6 is a diagram exemplifying a new pattern after the merge processing of patterns of the same precision in the first embodiment.

FIG. 6 is a diagram exemplifying a new pattern after the merge processing of patterns of the same precision in the first embodiment. In FIG. 6, the chips 42, 44, 46, 48 of the new patterns created after merge processing of the cut-out partial patterns 32, 34, 36, 38 respectively have the same precision as patterns on the high-precision side and thus, merge processing of all the chips is performed to create a high-precision pattern chip. On the other hand, a remaining partial pattern 21 on the low-precision side after the partial patterns 32, 34, 36, 38 being cut out is different in writing precision from the chips 42, 44, 46, 48 and so becomes an independent low-precision pattern chip.

Thus, write data reconfigured by merge processing and including data of high-precision pattern chips and data of low-precision pattern chips is output and stored in the storage device 142. By creating write data as described above, the proximity effect of patterns originally on the high-precision side can be corrected. Moreover, write data that can be written fast can be created.

As the data conversion process (S120), the control computer 120 reads one of data of high-precision pattern chips and data of low-precision pattern chips from the storage device 142 and performs a plurality of stages of data conversion processing and also proximity effect correction operations to generate shot data. The generated shot data is stored in the storage device 144. The proximity effect can be corrected by correcting, for example, the dose of an electron beam. The dose $D(x, U)$ of an electron beam can be calculated as a product of, for example, a base dose of the beam $D_{base}$ and a proximity effect correction dose $Dp(\eta, U)$ depending on a proximity effect correction coefficient $\eta$ to correct the proximity effect and a pattern area density $\rho$ or a proximity effect density $U$. A dose calculation formula is defined by, for example, the following Formula (2). The function $U(x)$ is defined by, for example, the following Formula (1). For a function $g(x)$, for example, the Gaussian distribution function can be used. However, the proximity effect correction and dose calculation formulas are not limited to the above formulas. Other methods may also be used. When operating the proximity effect correction dose $Dp(\eta, U)$, the radius of influence of $3\sigma$ as the range of influence of the proximity effect may be adopted as the range of integral.

(1)

(2)

As the writing process (S122), the pattern writing unit 150 writes a pattern obtained by merge processing and a remaining partial pattern to the target object 101 using an electron beam 200 under different writing conditions based on data of the pattern obtained by merge processing and data of the remaining partial pattern on the low-precision side remaining without being merged with patterns on the high-precision side. More specifically, the control circuit 130 first operates the pattern writing unit 150 as described below along the generated shot data.

The electron beam 200 emitted from the electron gun assembly 201 (emission unit) is controlled to pass through the blanking aperture plate 214 by the blanking deflector 212 when passing through the blanking deflector 212 in a beam ON state and controlled to be deflected so that the whole beam is blocked by the blanking aperture plate 214 in a beam OFF state. The electron beam 200 having passed through the blanking aperture plate 214 during a time from the beam OFF state to the beam ON state and back to the beam OFF state becomes an electron beam for one shot. The blanking deflector 212 alternately generates the beam ON state and the beam OFF state by controlling the orientation of the passing electron beam 200. For example, no voltage may be applied for the beam ON state and a voltage may be applied to the blanking deflector 212 for the beam OFF state. The dose of the electron beam 200 shone on the target object 101 per shot is adjusted by the irradiation time T of each of such shots.

The electron beam 200 of each shot thus generated by being passed through the blanking deflector 212 and the blanking aperture plate 214 illuminates the whole first shaping aperture plate 203 having an oblong, for example, rectangular hole through the illumination lens 202. Here, the electron beam 200 is first formed into an oblong, for example, rectangular shape. Then, the electron beam 200 of a first aperture image having passed through the first shaping aperture plate 203 is projected onto the second shaping aperture plate 206 through the projection lens 204. The first aperture image on the second shaping aperture plate 206 is deflected/controlled by the deflector 205 so that the beam shape and dimensions thereof can be changed (variably shaped). Such variable shaping is performed for each shot and a different beam shape and dimensions are normally formed for each shot. Then, the electron beam 200 of a second aperture image having passed through the second shaping aperture plate 206 is focused by the objective lens 207 and deflected by the deflector 208 before being shone onto a desired position of the target object arranged on the continuously moving X-Y stage 105.

When the pattern on the high-precision side obtained by merge processing and the remaining partial pattern on the low-precision side are written, at least one of the maximum shot size, the settling time when the beam is deflected, and the multiplicity is changed as writing conditions. That is, when the remaining partial pattern on the low-precision side is written, the shot size is made larger than the shot size for the pattern on the high-precision side. By making the shot size larger, the number of shots can be reduced so that the pattern can be written faster. For the deflection control of the blanking deflector 212 and the deflectors 205, 208, a DAC (digital analog converter) amplifier for deflecting voltage application is used. The settling time (stabilization period) before the stable deflection voltage is obtained is needed between the last deflection control and the next deflection control. When the remaining partial pattern on the low-precision side is written, the settling time is set shorter than the settling time for the pattern on the high-precision side. Though the writing precision deteriorates due to the shorter settling time, the settling time can be reduced so that the pattern can be written faster. When the multiplicity N when multiple exposure is performed is changed, the following step is preferably taken. That is, when the remaining partial pattern on the low-precision side is written, the multiplicity is made smaller than the multiplicity for the pattern on the high-precision side. The number of exposure is reduced by making the multiplicity smaller so that the writing time can be shortened. The multiplicity at the time of writing a pattern on the high-precision side may be set as N=4 and the multiplicity at the time of writing a pattern on the low-precision side may be set as N=2. Values of the multiplicity are not limited to these values and the multiplicity may take other values as long as the multiplicity when a pattern on the low-precision side is written is set smaller than when a pattern on the high-precision side is written.

Changing the settings of the maximum shot size and settling time in the same writing processing makes a complex control method for exercising writing control and thus, when the pattern obtained by performing merge processing and the remaining partial pattern are written, one of the pattern obtained by performing merge processing and the remaining partial pattern is written, and then the other one of the pattern obtained by performing merge processing and the remaining partial pattern is written after pattern writing of the one of the pattern obtained by performing merge processing and the remaining partial pattern is completed. That is, for example, after all writing processing of the pattern on the high-precision side obtained by performing merge processing under writing conditions for the high-precision pattern is completed, writing processing of the remaining partial pattern on the low-precision side is performed under writing conditions for the low-precision pattern. Alternatively, the order of writing processing may be reversed. By moving the X-Y stage 105 at variable speeds, a region in which the pattern is not written can be moved at high speed. Shot data generation and writing processing by the control computer 120 can be advanced in real time. Thus, for example, data conversion processing of the pattern on the high-precision side obtained by performing merge processing is first performed, writing is started with the region whose conversion processing is completed, and after the data conversion processing of the pattern on the high-precision side is completed, data conversion processing of the remaining partial pattern on the low-precision side is performed and writing is started with the region whose conversion processing is completed.

According to the first embodiment, as described above, merge processing of a partial pattern positioned within the range of influence of the proximity effect from a region edge of a pattern on the high-precision side and the pattern on the high-precision side is performed. Thus, the proximity effect of patterns on the high-precision side can be corrected. Further, write data that can be written fast can be created.

According to the first embodiment, as described above, faster pattern writing is enabled while improving dimensional precision of high-precision patterns.

In the foregoing, the embodiment has been described with reference to concrete examples. However, the present invention is not limited to the concrete examples.

Although parts such as an apparatus configuration and a control method which are not directly required for the explanation of the present invention have not been described, a required apparatus configuration or a required control method can be appropriately selected and used. For example, a control unit configuration which controls the writing apparatus 100 has not been described. However, a necessary control unit configuration is appropriately selected and used, as a matter of course.

In addition, all write data creation methods, charged particle beam writing methods and charged particle beam writing apparatuses which include the elements of the present invention and can be attained by appropriate change in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus, comprising:
a storage device configured to store write data which is to be written by using a charged particle beam and in which a plurality of patterns with different writing precision is defined;
a cutout unit configured to read data of each pattern from the storage device and to cut out a partial pattern, among a pattern, in the plurality of patterns, whose writing precision is on a low-precision side, positioned within a range of influence of a proximity effect from a region edge of a pattern, in the plurality of patterns, whose writing precision is on a high-precision side;
a merge processing unit configured to perform merge processing of a cut-out partial pattern on the low-precision side and the pattern on the high-precision side; and
a pattern writing unit configured to write a pattern obtained by the merge processing and a remaining partial pattern on the low-precision side remaining without being merged with the pattern on the high-precision side to a target object by using the charged particle beam under different writing conditions based on data of the pattern obtained by the merge processing and data of the remaining partial pattern.

2. The apparatus according to claim 1, wherein when writing the pattern obtained by performing the merge processing and the remaining partial pattern, the pattern writing unit writes the patterns by changing at least one of a maximum shot size, a settling time when a beam is deflected, and a multiplicity as the writing conditions.

3. The apparatus according to claim 1, wherein when writing the pattern obtained by performing the merge processing and the remaining partial pattern, the pattern writing unit writes one of the pattern obtained by performing the merge processing and the remaining partial pattern and then writes an other one of the pattern obtained by performing the merge processing and the remaining partial pattern after writing of the one is completed.

4. The apparatus according to claim 1, further comprising:
a presence determination unit configured to input data of each pattern from the storage device and to determine whether an other pattern is present within the range of influence of the proximity effect from a region edge of a target pattern in the plurality of patterns.

5. The apparatus according to claim 4, wherein the storage device stores a writing precision necessary for each pattern as precision parameter data, further comprising:
a precision determination unit configured to determine whether the writing precision defined for the other pattern present within the range of influence of the proximity effect from the region edge of the target pattern is lower than a writing precision defined for the target pattern by referring to the precision parameter data stored in the storage device.

6. A write data creation method, comprising:
reading data of each pattern from a storage device storing write data which is to be written by using a charged particle beam and in which a plurality of patterns with different writing precision is defined, and cutting out a partial pattern, among a pattern, in the plurality of patterns, whose writing precision is on a low-precision side, positioned within a range of influence of a proximity effect from a region edge of a pattern, in the plurality of patterns, whose writing precision is on a high-precision side;
performing merge processing of a cut-out partial pattern on the low-precision side and the pattern on the high-precision side; and
outputting data of a pattern obtained by performing the merge processing and data of a remaining partial pattern on the low-precision side remaining without being cut out.

7. A charged particle beam writing method, comprising:
reading data of each pattern from a storage device storing write data which is to be written by using a charged particle beam and in which a plurality of patterns with different writing precision is defined, and cutting out a partial pattern, among a pattern, in the plurality of patterns, whose writing precision is on a low-precision side, positioned within a range of influence of a proximity effect from a region edge of a pattern, in the plurality of patterns, whose writing precision is on a high-precision side;
performing merge processing of a cut-out partial pattern on the low-precision side and the pattern on the high-precision side; and
writing a pattern obtained by the merge processing and a remaining partial pattern on the low-precision side remaining without being merged with the pattern on the high-precision side to a target object by using the charged particle beam under different writing conditions based on data of the pattern obtained by the merge processing and data of the remaining partial pattern.

8. The method according to claim 7, wherein when writing the pattern obtained by performing the merge processing and the remaining partial pattern, the patterns are written by changing at least one of a maximum shot size, a settling time when a beam is deflected, and a multiplicity as the writing conditions.

9. The method according to claim 7, wherein when writing the pattern obtained by performing the merge processing and the remaining partial pattern, one of the pattern obtained by performing the merge processing and the remaining partial pattern is written and then an other one of the pattern obtained by performing the merge processing and the remaining partial pattern after writing of the one is completed.

10. The method according to claim 7, further comprising:
inputting data of each pattern from the storage device to determine whether an other pattern is present within the range of influence of the proximity effect from the region edge of a pattern before cutting out the partial pattern.

* * * * *